United States Patent [19]
Veloric
[11] 3,736,478
[45] May 29, 1973

[54] RADIO FREQUENCY TRANSISTOR EMPLOYING HIGH AND LOW-CONDUCTIVITY BASE GRIDS

[75] Inventor: Harold Seymour Veloric, Morristown, N.J.
[73] Assignee: RCA Corporation, New York, N.Y.

[22] Filed: Sept. 1, 1971
[21] Appl. No.: 176,811

[52] U.S. Cl..........317/235 R, 317/234 L, 317/235 Z, 317/235 AM, H01l/5/00
[51] Int. Cl..............................H01l 5/02, H01l 11/08
[58] Field of Search...................317/235 AM, 235 Z, 317/234 L

[56] References Cited

UNITED STATES PATENTS

| | | | |
|---|---|---|---|
| 3,567,506 | 3/1971 | Belardi | 317/235 Z |
| 3,500,143 | 3/1970 | Lamming | 317/235 Z |

*Primary Examiner*—John W. Huckert
*Assistant Examiner*—William D. Larkins
*Attorney*—G. H. Bruestle

[57] ABSTRACT

An RF transistor has base and collector regions and a plurality of discrete emitter segments extending into the base region. A highly conductive intermetallic, such as PtSi grid extends into the base region and individually surrounds each emitter segment. The highly conductive intermetallic, such as PtSi grid is separated from the collector region by a highly resistive grid of the same conductivity type as the base region.

6 Claims, 3 Drawing Figures

INVENTOR.
Harold S. Veloric
BY
H. L. Allen
ATTORNEY

Patented May 29, 1973 3,736,478

2 Sheets-Sheet 2

INVENTOR
Harold S. Veloric
BY H. L. Allen
ATTORNEY

RADIO FREQUENCY TRANSISTOR EMPLOYING HIGH AND LOW-CONDUCTIVITY BASE GRIDS

BACKGROUND OF THE INVENTION

The present invention relates to semiconductor devices, and in particular, relates to transistors that are designed to operate at radio frequencies.

The development of the overlay transistor has been recognized as an important advance in the power and frequency capabilities of RF Transistors; this device is disclosed in U.S. Pat. No. 3,434,019 to Carley. In an overlay transistor, the emitter consists of a plurality of discrete segments extending into the base region from the top surface of the device. Base current is evenly distributed around the emitter segments by a deeply diffused, highly conductive grid extending through the base region and surrounding each of the emitter segments.

THE DRAWING

DETAILED DESCRIPTION

Figure 1:
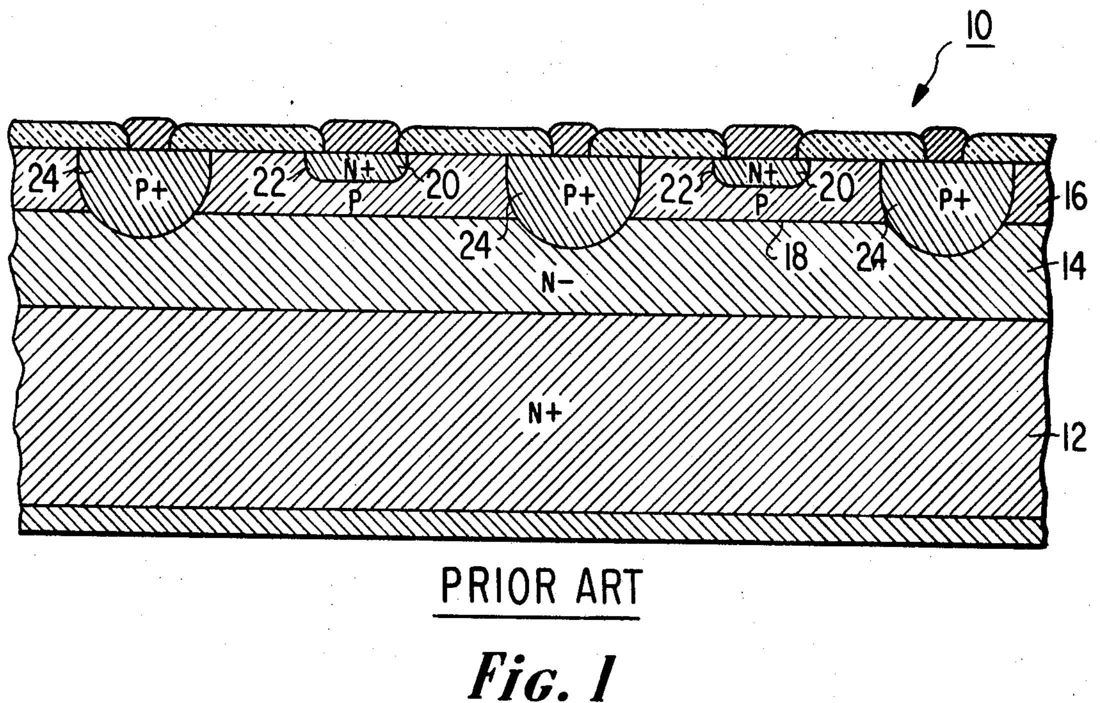
PRIOR ART FIG. 1
FIG. 1 is a cross-section of a broken portion of an overlay transistor in accordance with the prior art.

An NPN overlay transistor 10 in accordance with the prior art is shown in FIG. 1.

The transistor 10 has a collector which generally comprises an N+ substrate 12 and an N− collector region 14. A P type base region 16 forms a base-collector PN junction 18 with the collector region 14. A plurality of discrete emitter segments 20 extend into the base region 16 from the device's planar surface, with each segment 20 forming an emitter-base junction 22 with the base region. A deep, highly conductive P+ grid 24 extends through the base region 16 into the collector region 14 and surrounds each emitter segment 20. This highly conductive grid 24 conducts base current evenly to the base region 16 and insures that relatively uniform current injection occurs along the entire periphery of each emitter base junction 22.

One embodiment of an RF transistor made in accordance with the present invention will be described with reference to FIG. 2.

The transistor, referred to generally as 30, is formed in a semiconductor, e.g. silicon, body 32, a portion of which is broken away. The body 32 has upper and lower surfaces 34 and 36, respectively. The size, shape, and conductivity of the device is not critical to this invention. By way of example, however, the body 32 may be 60.0 mils long, 30.0 mils wide, and between 4.0 and 8.0 mils thick. While the transistor 30 may be an NPN or PNP device, an NPN device is shown in the drawing and described below.

The transistor 30 includes a collector within the semiconductor body 32. Preferably, the collector includes a highly conductive (N+) substrate 38 and a highly resistive (N−) region 40 adjacent the substrate. A base region 42 of a conductivity type opposite to that of the collector region 40 (P type in this example), extends to the collector region 40 from the upper surface 34, and is separated from the collector by a base-collector PN junction 41. The dimensions of the collector and base regions 40 and 42 are not critical. However, both regions are suitably as thin as is possible consistent with other design criteria. By way of example, the collector region 40 may be between 0.2 and 2.0 mils thick, and the base region 42 preferably extends no more than 0.2 mils into the semiconductor body 32.

A plurality of emitter segments 44 of the same type conductivity as the collector region 40 extend into the base region 42 from the upper surface 34. Each segment 44 forms an emitter-base PN junction 43 with the base region 42.

An insulating coating 46, of silicon dioxide or silicon nitride, for example, is disposed on the upper surface 34. In practice, the insulating coating 46 is very thin, on the order of 5,000 to 20,000 A thick.

A highly conductive (P+) grid 48 of the same conductivity type as the base region 42 extends into the base region and is spaced apart from, and individually surrounds each emitter segment 44. This grid 48 is "highly conductive" relative to the base region 42. The highly conductive grid 48 preferably extends through the base region 42 and beyond the base-collector junction 41 into the collector region 40. The transistor 30 as described thus far, is the same as the prior art transistor 10 of FIG. 1.

The transistor 30 further comprises a highly resistive (P− in this example) grid 50 of the same type conductivity as the highly conductive grid 48 disposed only between, and in contact with, the highly conductive grid and the collector region 40. The highly resistive grid 50 is more resistive than either the base region 42 or the highly conductive grid 48, and forms a high-low junction 49 with the highly conductive grid. A high-low junction is defined as an interface between two distinct semiconductor regions of like conductivity type but of different impurity concentrations. Preferably, the highly resistive grid 50 is relatively thin; for example it may be between 0.060 and 0.110 mils thick.

The transistor 30 is completed with emitter, base and collector contacts 52, 53, and 54 made to the emitter segments 44, the highly conductive grid 48, and the collector substrate 38, respectively.

The transistor 30 can be made in accordance with the teachings of the Carley patent discussed above, except that the highly resistive grid 50 is diffused through a standard grid-shaped opening in the oxide 46 just prior to the diffusion of the highly conductive grid 48. The highly conductive grid 48 may then be diffused through the same grid opening.

Figure 2:
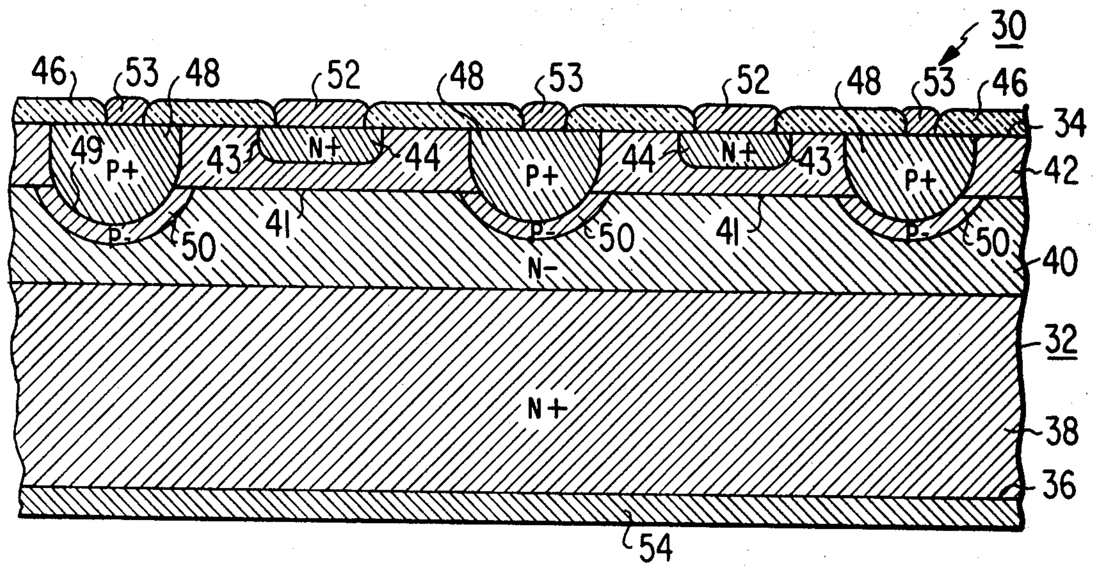
FIG. 2 is a cross-section of a broken portion of one embodiment of an RF transistor in accordance with the present invention.

The transistor 30 in FIG. 2 results in a higher base-collector junction breakdown voltage capability for a given collector resistivity than is possible in conventional overlay devices. Further, the highly resistive grid 50 achieves a lower and more linear output capacitance than is achieved with the use of the highly conductive grid alone.

Figure 3:
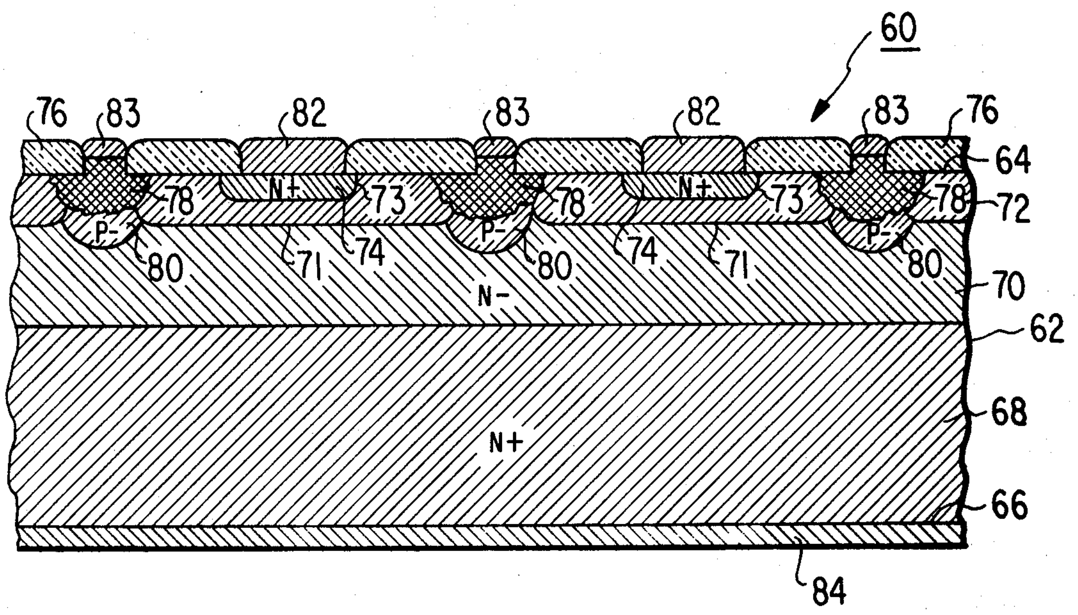
FIG. 3 is a cross-section of a broken portion of a second embodiment of the present invention.

A second embodiment of the invention, referred to generally as 60, is shown at FIG. 3. The transistor 60 is formed in a semiconductor body 62, a portion of which is broken away. The body 62 has upper and lower surfaces 64 and 66, respectively.

The transistor 60 includes a collector within the semiconductor body 62 which includes a highly conductive (N+) substrate 68 and a highly resistive (N−) region adjacent the substrate. A base region 72 of a conductivity type opposite to that of the collector region 70 (P type in this example), extends to the collector region 70 from the upper surface 64, and is separated from the collector by a base-collector PN junction 71.

A plurality of emitter segments 74 of the same type conductivity as the collector region 70 extend into the base region 72 from the upper surface 64. Each segment 74 forms an emitter-base PN junction 73 with the base region 72. An insulating coating 76 is disposed on the upper surface 64.

A highly conductive, intermetallic grid 78 extends into the base region 72 and is spaced apart from, and individually surrounds each emitter segment 74. Suitable intermetallics that can be employed as the grid 78 include platinum silicide and palladium silicide, when the semiconductor body 62 comprises silicon. This highly conductive grid 78 is "highly conductive" relative to the base region 42. The highly conductive grid 78 preferably extends into the base region 72 but not beyond the base-collector junction 71. Because of the manner in which the intermetallic grid 78 is made, the grid forms an irregular interface within the semiconductor body 62, as is shown in FIG. 3.

The transistor 60 further comprises a highly resistive (P− in this example) grid 80 of the same type conductivity as the base region 72 disposed only between and in contact with the intermetallic grid 78 and the collector region 70. The highly resistive grid 80 is more resistive than the base region 72.

The transistor 60 is completed with emitter, base and collector contacts 82, 83 and 84 made to the emitter segments 74, the intermetallic grid 78, and the collector substrate 68, respectively.

The transistor 60 can be fabricated by known techniques similar to those described above, except that the highly conductive intermetallic grid 78 can be made in accordance with the teachings of R. Duclos and D. Jacobson in U.S. Pat. application Ser. No. 131,229, filed Apr. 5, 1971.

In this embodiment, the highly resistive grid 80 significantly reduces the number of "shorts" which would otherwise extend from the intermetallic grid 78 to the base-collector junction 71, and also achieves a lower and more linear output capacitance than can be achieved with the intermetallic grid alone.

I claim:

1. A semiconductor device comprising:

a semiconductor body having a surface;

a first region of a first conductivity type in said body;

a second region of a second conductivity type in said body adjacent said first region and extending to said surface;

a highly conductive, intermetallic region extending into said second region from said surface; and a highly resistive region of said second conductivity type sandwiched between and totally separating said first and intermetallic regions, said highly resistive region being highly resistive relative to said second and intermetallic regions.

2. A device according to claim 1, wherein said highly resistive region is in contact with said first and intermetallic regions.

3. A semiconductor device, comprising:

a semiconductor body having a surface;

a first region of a first conductivity type in said body;

a second region of a second conductivity type in said body adjacent said first region and extending to said surface;

a third region extending into said second region from said surface, said third region comprising an intermetallic alloy of said semiconductor body;

a fourth region of said second conductivity type sandwiched between and totally separating said first and third regions, said fourth region being highly resistive relative to said second region.

4. A semiconductor device according to claim 3, further comprising:

a fifth region of said first conductivity type extending into said second region from said surface; and said third region being spaced apart from said fifth region.

5. A semiconductor device according to claim 4, wherein said third region surrounds said fifth region.

6. In a transistor of the type formed in a semiconductor body having a surface, with a first conductivity type collector region in said body and a second conductivity type base region in said body and adjacent said collector region and extending to said surface, and with a plurality of discrete, first conductivity type emitter segments extending into said base region from said surface, said transistor also having a highly conductive, intermetallic grid extending into said base region and surrounding each said emitter segment, the improvement comprising:

a highly resistive, second conductivity type grid sandwiched between and totally separating said intermetallic grid and said collector region; and a stepped, high-low junction between said highly conductive and said highly resistive grids.

* * * * *